United States Patent
Lee

(10) Patent No.: US 7,369,448 B2
(45) Date of Patent: *May 6, 2008

(54) INPUT CIRCUIT FOR MEMORY DEVICE

(75) Inventor: Chang Hyuk Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/654,955

(22) Filed: Jan. 18, 2007

(65) Prior Publication Data

US 2007/0115732 A1    May 24, 2007

Related U.S. Application Data

(63) Continuation of application No. 11/092,382, filed on Mar. 29, 2005, now Pat. No. 7,184,325.

(30) Foreign Application Priority Data

Apr. 28, 2004  (KR)  ........................ 10-2004-0029604

(51) Int. Cl.
*G11C 7/10* (2006.01)
(52) U.S. Cl. .............................. 365/189.05; 365/189.02
(58) Field of Classification Search ................. 365/240
See application file for complete search history.

(56) References Cited

U.S. PATENT DOCUMENTS

| 5,198,999 | A * | 3/1993 | Abe et al. ............... 365/189.05 |
| 6,292,428 | B1 * | 9/2001 | Tomita et al. ............... 365/233 |
| 6,320,819 | B2 * | 11/2001 | Tomita et al. ............... 365/233 |
| 7,184,325 | B2 * | 2/2007 | Lee ........................ 365/189.05 |
| 2006/0067151 | A1 * | 3/2006 | Miyamoto ................... 365/222 |

* cited by examiner

*Primary Examiner*—Tan T. Nguyen
(74) *Attorney, Agent, or Firm*—Ladas & Parry LLP

(57) ABSTRACT

An input circuit for a semiconductor memory device is disclosed. The input circuit controlling transmission paths for data having passed through a data input buffer by using a 1-clock shifted block column address is provided. In particular, a data input apparatus improving a data processing speed by advancing an operation time point of a data bus writer is provided.

4 Claims, 6 Drawing Sheets

INPUT CIRCUIT FOR MEMORY DEVICE

This application is a continuation of U.S. application Ser. No. 11/092,382 filed on Mar. 29, 2005, now U.S. pat. No. 7,184,325 entitled, Imput Circuit for Memory Device.

BACKGROUND OF THE INVENTION

1. Field of the Invention

The present invention relates to an input circuit of a memory device, and more particularly to an input circuit for a memory device, which improves a data processing speed by controlling transmission paths for data having passed through a data input buffer in response to an input of a block address.

2. Description of the Prior Art

The data processing speed of a semiconductor memory device is gradually accelerating. Moreover, with the development of a DDR SDRAM capable of accessing two data in one clock, the data processing speed of the memory device accelerates further. In particular, a processing for input data is one of issues important for improving the data processing speed of the memory device.

FIG. 1 is a block diagram showing the data input circuit of a conventional memory device. Specifically, the memory device disclosed in the present specification denotes a DDR SDRAM, a DDR2 SDRAM (next generation memory device), etc.

As shown in FIG. 1, the conventional data input circuit includes data buffers 101 and 102, an input multiplexer 103, data bus writers 105 and 106, block writers 107 and 108, and an input selection signal generation circuit 104 for controlling the operations of the data bus writers 105 and 106.

For convenience of description, FIG. 1 shows only two data buffers 101 and 102. However, when the memory device has a data input/output structure of ×16, the number of the data buffers is 16. Accordingly, it is noted that 14 data buffers exist in addition to the data buffers 101 and 102 shown in FIG. 1.

The basic operation of each element is as follows.

The data buffers 101 and 102 controlled by a control signal Din clk receive corresponding data D0 and D1 respectively, and output data D0_and D_. Herein, the control signal Din clk is a signal (or clock) generated by the number of times of BL/2 after a write command and denotes a signal generated in synchronization with the rising edge of a first DQS signal.

The input multiplexer 103 is a circuit for determining transmission paths of the data D0_1 and D_1. Herein, the reason for determining the transmission paths of the data is because the memory device having the data input/output structure of ×16 type may be used in a data input/output structure of ×8 type as the situation requires.

For instance, when a data pin of the memory device is set to ×16, it is assumed that 16 bit data are applied to the memory device. In such a case, the data D0_1 are sent to the data bus writer 105 along a solid line and the data D1_1 are sent to the data bus writer 106 along a solid line. Other data D2_1 , . . . , D15_1 are sent to data bus writers along solid lines.

In a state in which the data pin of the memory device is set to ×16, if is assumed that 8 bit data are applied to the memory device, 8 used buffers of 16 buffers are necessary and the other 8 buffers are unnecessary.

Meanwhile, even though the data pass through the data buffers 101 and 102, it is necessary to determine the data bus writer, to which the data are to be sent, by the input multiplexer 103. For instance, the data D0_1 having passed through the data buffer 101 are sent to one of the two data bus writers 105 and 106 by the input multiplexer 103. Herein, when data having the number of bits smaller than the predetermined number of bits are applied, the input multiplexer 103 includes a function of determining the transmission paths of the data.

The data bus writers 105 and 106 send the data transmitted from the input multiplexer 103 to global input lines gio0 and gio1. When the memory device operates in ×16 type, the data bus writers send the data transmitted from the input multiplexer to the global input lines. Further, when the memory device operates in ×8 type, it is necessary to maintain the output terminal of a data bus writer, to which data are not inputted, in an initialization state or precharge state.

The block writers 107 and 108 send the data to memory blocks through local input lines lio0 and lio1. Herein, the memory block signifies an area subdivided in a memory bank and the memory bank includes a plurality of memory blocks.

The input selection signal generation circuit 104 receives a 2-clock shifted block column address and a control signal clk Din and outputs signals for controlling the operations of the data bus writers 105 and 106. Herein, the 2-clock shifted block column address is a two-clock delayed signal than an input column address inputted by a write command as shown in FIG. 2. That is, the 2-clock shifted block column address is an address for selecting the specific block of the memory bank. The control signal clk Din is a clock signal generated by the number of times of BL/2 after a two-clock delay after the write command. That is, as shown in FIG. 2, the control signal clk Din is a clock signal generated in synchronization with the rising edge of a clock clk at a time point t3.

FIG. 2 is a waveform view illustrating the operation of the circuit of FIG. 1.

In FIG. 2, the clock clk denotes a clock signal applied to the memory device and the control signal Din clk is a signal for controlling the data buffers 101 and 102. Further, the data D0_2 denotes data outputted from the input multiplexer 103 and the control signal clk Din is a two-clock delayed clock signal after the write command. The 2-clock shifted block column address is a signal two-clock delayed than a column address inputted in synchronization with the same clock as the write command input.

In the operation of the memory device, the input selection signal generation circuit 104 enables the data bus writers 105 and 106 when both the 2-clock shifted block column address and the control signal clk Din are in high level.

However, in the prior art, after the 2-clock shifted block column address has been generated, the control signal clk Din is generated after a predetermined period of time passes. That is, after the 2-clock shifted block column address has been generated, the control signal clk Din is generated with a predetermined time margin. Therefore, in the prior art, the operation time of the data bus writer is delayed by the time margin, so that a data transmission speed slows.

SUMMARY OF THE INVENTION

Accordingly, the present invention has been made to solve the above-mentioned problems occurring in the prior art, and it is an object of the present invention to provide an input circuit capable of improving a data processing speed by accelerating the operation time point of a data bus writer.

It is another object of the present invention to provide an input circuit capable of improving a data processing speed by shifting a block column address inputted in a write command by one clock and using the shifted block column address.

In order to achieve the above objects, according to one aspect of the present invention, there is provided an input circuit for a memory device operating in synchronism with a clock signal comprising: data buffer part for receiving data applied from an external of the input circuit; input multiplexer part for receiving the data passed through the data buffer part; data bus writer part receiving the data passed through the input multiplexer part and outputting the data to global input/output lines of the memory device; and input selection signal generation circuit outputting a signal to control the operation of the data bus writer part, wherein the output signal of the input selection signal generation circuit is activated when both a first control signal generated after a write command is applied and then the clock signal is toggled n times and a second control signal generated after a write command is applied and then the clock signal is toggled n−1 times are enabled.

In the present invention, the first control signal is generated in synchronism with a rising edge of the n-th clock signal generated after the write command is applied, and the second control signal is generated in synchronism with a rising edge of the (n−1)-th clock signal generated after the write command is applied.

In the present invention, the second control signal is generated by shifting by 1tCK a block column address inputted to the memory device when the write command is applied.

In order to achieve the above objects, according to one aspect of the present invention, there is provided an input circuit for a memory device comprising: 2N data buffers for receiving data applied from an external of the input circuit; N input multiplexers; 2N data bus writers; N block column address shifters; and N input selection signal generation circuits, Wherein each pair of data buffer of the 2N data buffers is connected to each of the N input multiplexers, each of the N input multiplexers is connected to said each pair of data bus writers of the 2N data bus writers, and each of the N input selection signal generation circuits controls an operation of said each pair of data bus writers of the 2N data bus writers.

In the present invention, the input selection signal generation circuit allows the $i^{th}$ and the $i+1^{th}$ data bus writer to be enabled in a predetermined case, and the input selection signal generation circuit allows a data bus writer receiving the third data of the $i^{th}$ and the $i+1^{th}$ data bus writer to be enabled in a predetermined case.

In order to achieve the above objects, according to one aspect of the present invention, there is provided an input circuit of a memory device comprising: a plurality of data buffers for inputting data applied from outside; an input multiplexer being connected to two or more data buffers, for multiplexing output data of the data buffers; a block column address shifter for outputting a block column address one-clock delayed than a column address; an input selection signal generation circuit for inputting the block column address and a control signal generated in a write operation; and a data bus writer being connected to an output terminal of the input multiplexer, for operating in response to an output signal of the input selection signal generation circuit.

In the present invention, the data buffers operate in response to an input of a second control signal generated in synchronization with a DQS signal.

In the present invention, the block column address shifter comprises: a first transmitter for synchronizing an input of an address latched by a clock signal, which is applied from outside, with a first pulse signal generated in a write command or a read command, and transmitting the synchronized signal; a second transmitter for transmitting a signal outputted from the first transmitter in response to an input of an internal clock synchronized with an external clock; a third transmitter for transmitting a signal outputted from the second transmitter in response to an input of a second pulse signal generated after one clock after a write command; a delay unit for delaying a signal outputted from the third transmitter; and an output unit for inputting an optical signal and an output signal of the delay unit and outputting a 1-clock shifted block column address.

In the present invention, the block column address shifter comprises: a first transmitter for synchronizing an input of an address latched by a clock signal, which is applied from the external, with a first pulse signal generated in a write command or a read command, and transmitting the synchronized signal; a second transmitter for transmitting a signal outputted from the first transmitter in response to an input of an internal clock synchronized with an external clock; a third transmitter for transmitting a signal outputted from the second transmitter in response to an input of a second pulse signal generated after one clock after a write command; a delay unit for delaying a signal outputted from the third transmitter; an output unit for inputting an optical signal and an output signal of the delay unit and outputting a 1-clock shifted block column address; and a fourth transmitter for transmitting an input of the latched address to the third transmitter in response to an input of a third pulse signal generated in a read command.

In the present invention, the input selection signal generation circuit comprises: a first decoder for inputting a first 1-clock shifted block column address and a first option signal; a second decoder for inputting a second 1-clock shifted block column address and a second option signal; a first output unit for inputting output signals of the first decoder and the second decoder and the control signal and outputting a first driving signal; a second output unit for inputting the first 1-clock shifted block column address, the output signal of the second decoder and the control signal, and outputting a second driving signal; a third output unit for inputting the second 1-clock shifted block column address, the output signal of the first decoder and the control signal, and outputting a third driving signal; and a fourth output unit for inputting the first 1-clock shifted block column address, the second 1-clock shifted block column address and the control signal, and outputting a fourth driving signal.

In the present invention, the data bus writer comprises: a first data bus writer being connected to a first output terminal of the input multiplexer to output data to a first global input line; and a second data bus writer being connected to a second output terminal of the input multiplexer to output data to a second global input line.

In the present invention further comprises: a first block writer being connected to the first data bus writer to output data to a first local data line; and a second block writer being connected to the second data bus writer to output data to a second local data line.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 3:
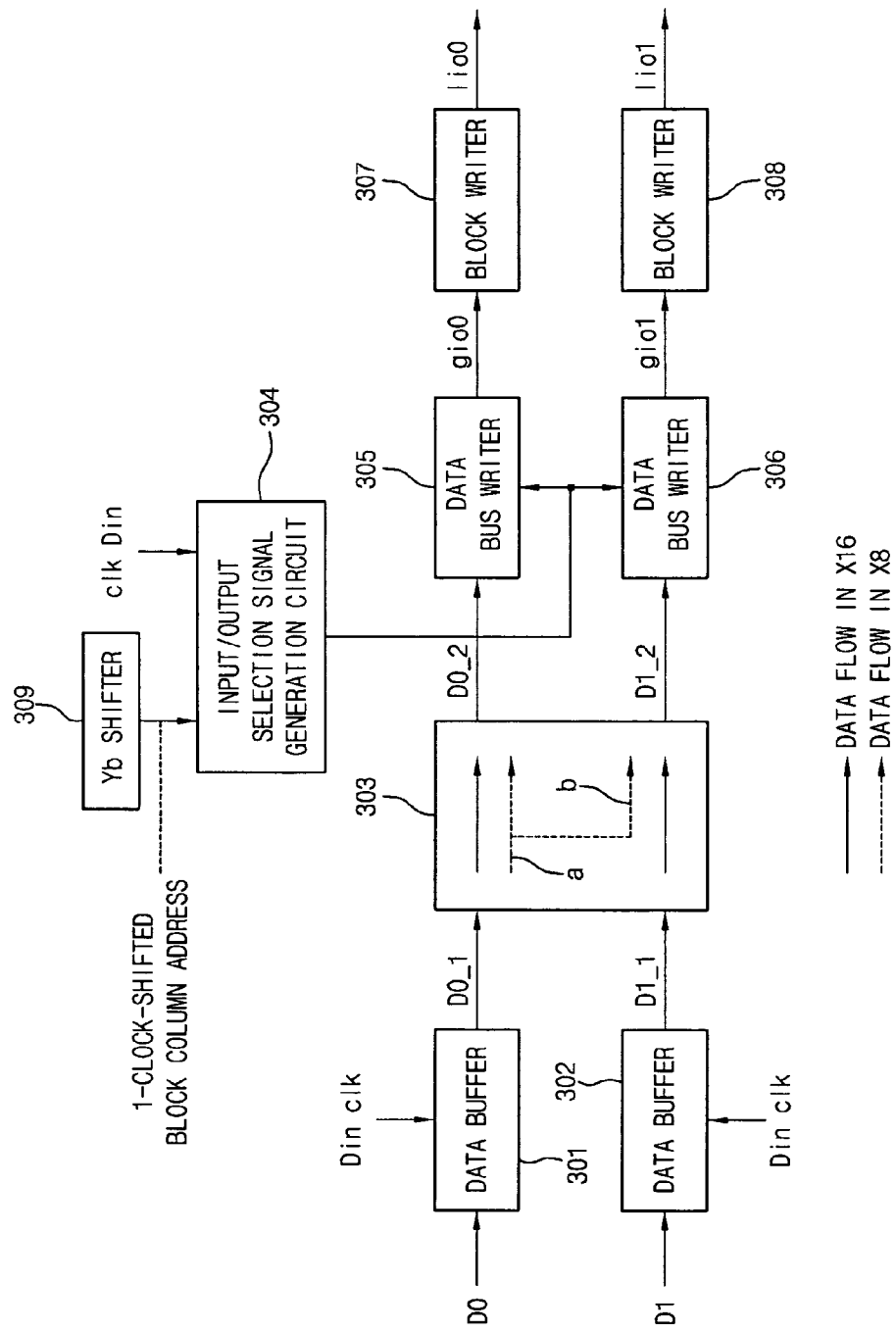
FIG. 3 is a block diagram of a data input circuit according to the present invention.

FIG. 3 is a block diagram showing a data input circuit according to the present invention. Hereinafter, a ×16 type in which the number of data buffers is 16 will be described.

The data input circuit of a memory device according to the present invention includes data buffers 301 and. 302, an input multiplexer 303, a Yb shifter 309, an input selection signal generation circuit 304, data bus writers 305 and 306, and block writers 307 and 308. The data buffers 301 and 302 input data D0 and D1 applied from the external of the data input circuit, and the input multiplexer 303 is connected to the data buffers 301 and 302 and multiplexes the output data D0_1 and D1_1 of the data buffers 301 and 302. The Yb shifter 309 is a block column address shifter outputting a block column address one-clock delayed than a column address. The input selection signal generation circuit 304 inputs the block column address and a control signal clk Din generated in a write operation. The data bus writers 305 and 306 are connected to the output terminal of the input multiplexer 303 and operate in response to the output signal of the input selection signal generation circuit 304. The block writers 307 and 308 output the outputs gio0 and gio1 of the data bus writers 305 and 306 to local data lines.

For convenience of description, FIG. 3 shows only two data buffers 301 and 302. However, since it is assumed that the data input/output structure is the ×16, it is noted that 14 data buffers exist in addition to the data buffers 301 and 302. The basic structures of the 14 data buffers are identical to those of the data buffers 301 and 302 of FIG. 3.

Figure 1:
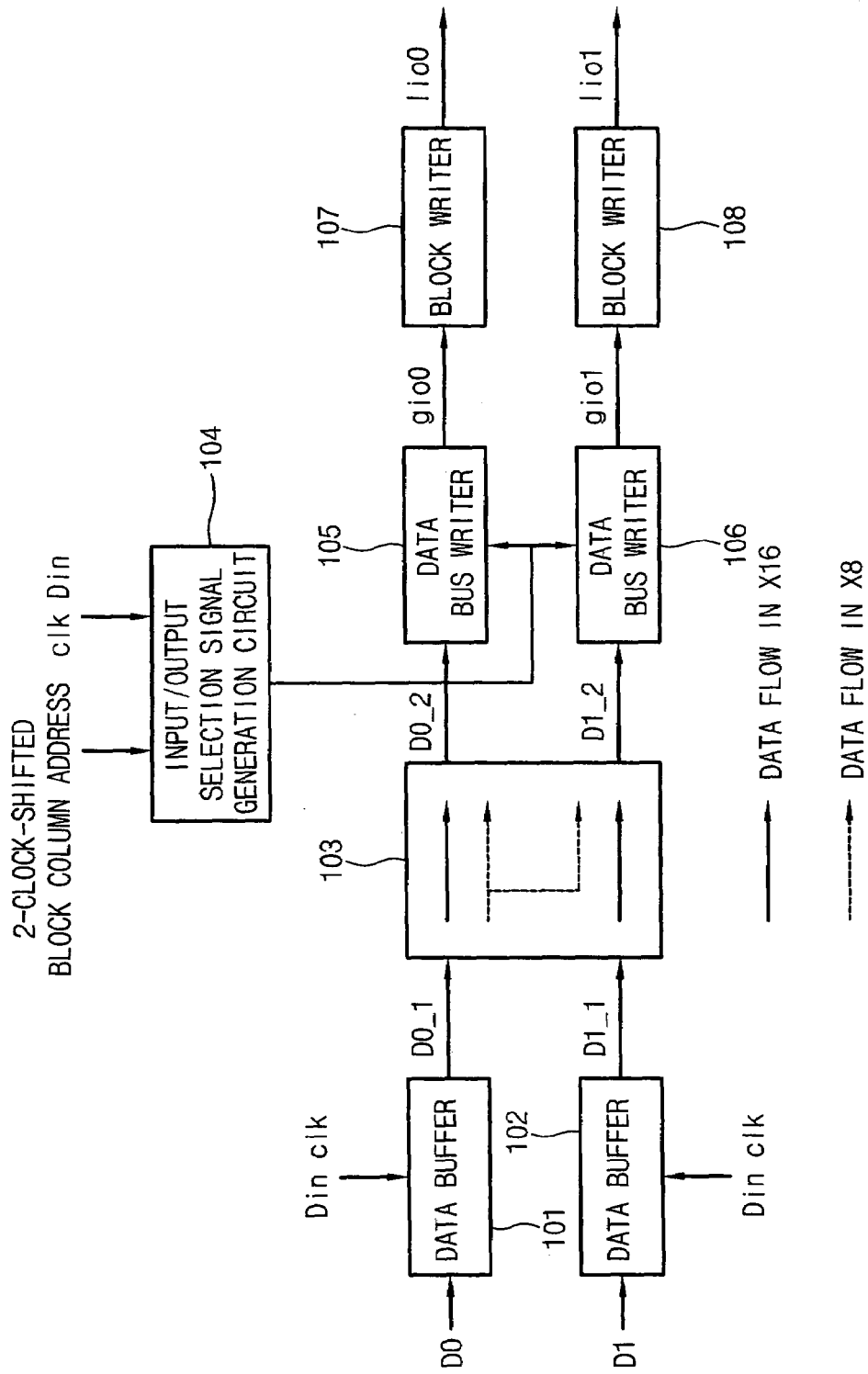
FIG. 1 is a block diagram showing the data input circuit of a conventional memory device.

Further, the basic constructions of the data buffers 301 and 302, the data bus writers 305 and 306, and the block writers 307 and 308 of FIG. 3 are actually identical to those of the data buffers 101 and 102, the data bus writers 105 and 106, and the block writers 107 and 108 of FIG. 1.

Figure 4:
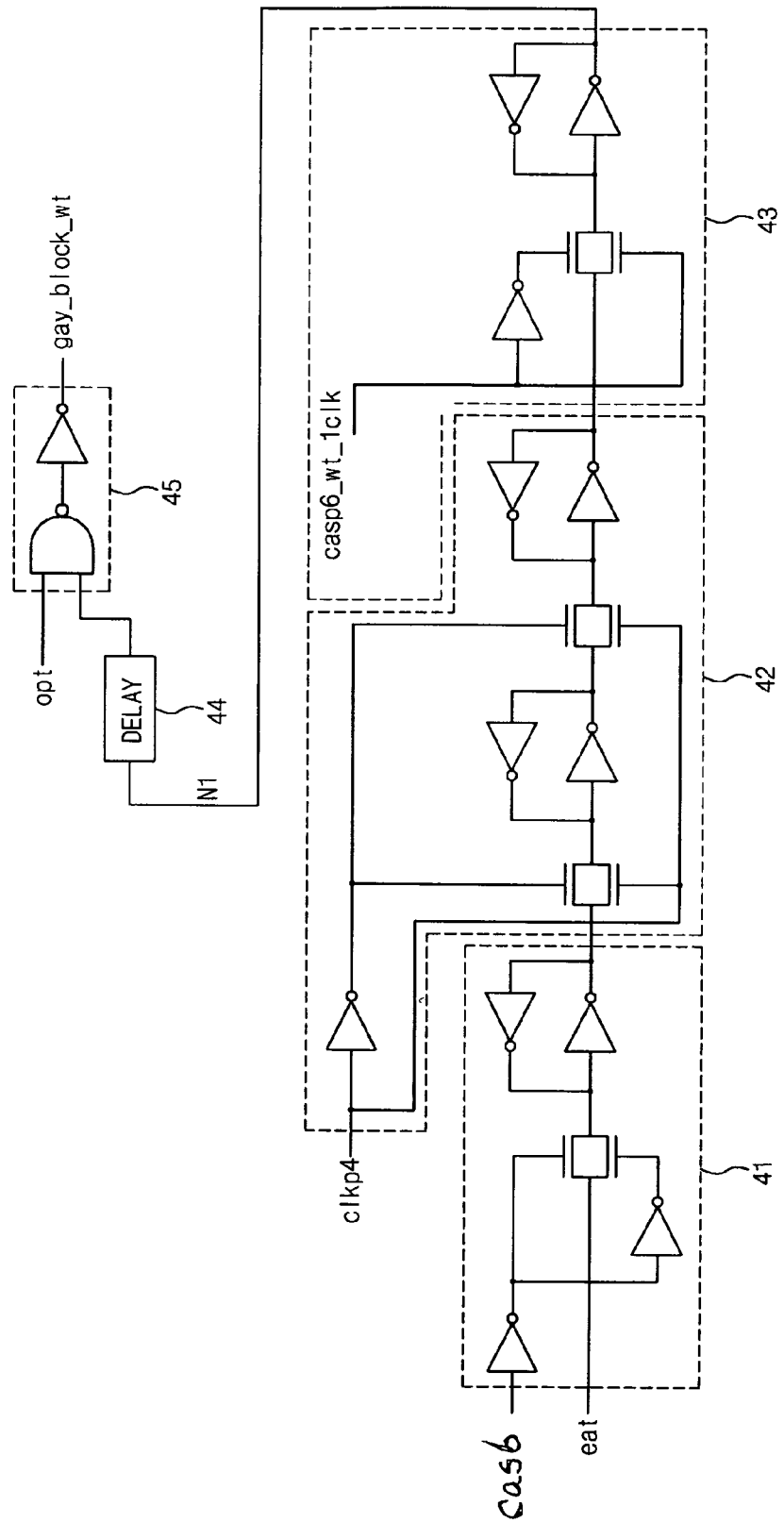
FIG. 4 is a circuit diagram showing the Yb shifter of FIG. 3 according to one embodiment of the present invention.

FIG. 4 is a circuit diagram showing the Yb shifter 309 (the block column address shifter of the data input circuit) according to an embodiment of the present invention.

The Yb shifter 309 according to the present invention includes a first transmitter 41, a second transmitter 42, a third transmitter 43 and a delay unit 44 and an output unit 45. The first transmitter 41 synchronizes the input of an address 'eat' latched by a clock signal, which is applied from the external of the Yb shifter 309, with a pulse signal cas6 generated in a write command or a read command, and transmits the synchronized signal. The second transmitter 42 transmits the signal outputted from the first transmitter 41 in response to the input of an internal clock clkp4 synchronized with an external clock. The third transmitter 43 transmits the signal outputted from the second transmitter 42 in response to the input of a pulse signal cas6_wt_lclk generated after one clock after a write command. The delay unit 44 delays the signal outputted from the third transmitter 43. The output unit 45 inputs an optical signal opt (e.g., a ×16 relating signal in the ×16 type) and the output signal of the delay unit 44 and outputs a 1-clock shifted block column address gay_blcok_wt.

In the above construction, each of the transmitters 41 to 43 is constructed by a transmission gate and a latch. Further, it is preferred that the delay unit 44 is constructed by a circuit (e.g., an inverter chain) capable of delaying the signal of a node N1. Furthermore, the output unit 45 is constructed by a NAND gate for inputting the optical signal opt and the output signal of the delay unit 44, and an inverter connected to the output terminal of the NAND gate.

The Yb shifter 309 shown in FIG. 4 has a constructive characteristic in which a result obtained by one-clock shifting the address eat inputted in the write command is transmitted to the node N1.

Meanwhile, the Yb shifter 309 as shown in FIG. 4. is a circuit realized by two-clock shifting an address only in a write operation, in consideration of a case in which a 2-clock shifted block column address inputs an address in both a read operation and a write operation in the prior art. Accordingly, a bus in the read operation must be additionally constructed.

Figure 5:
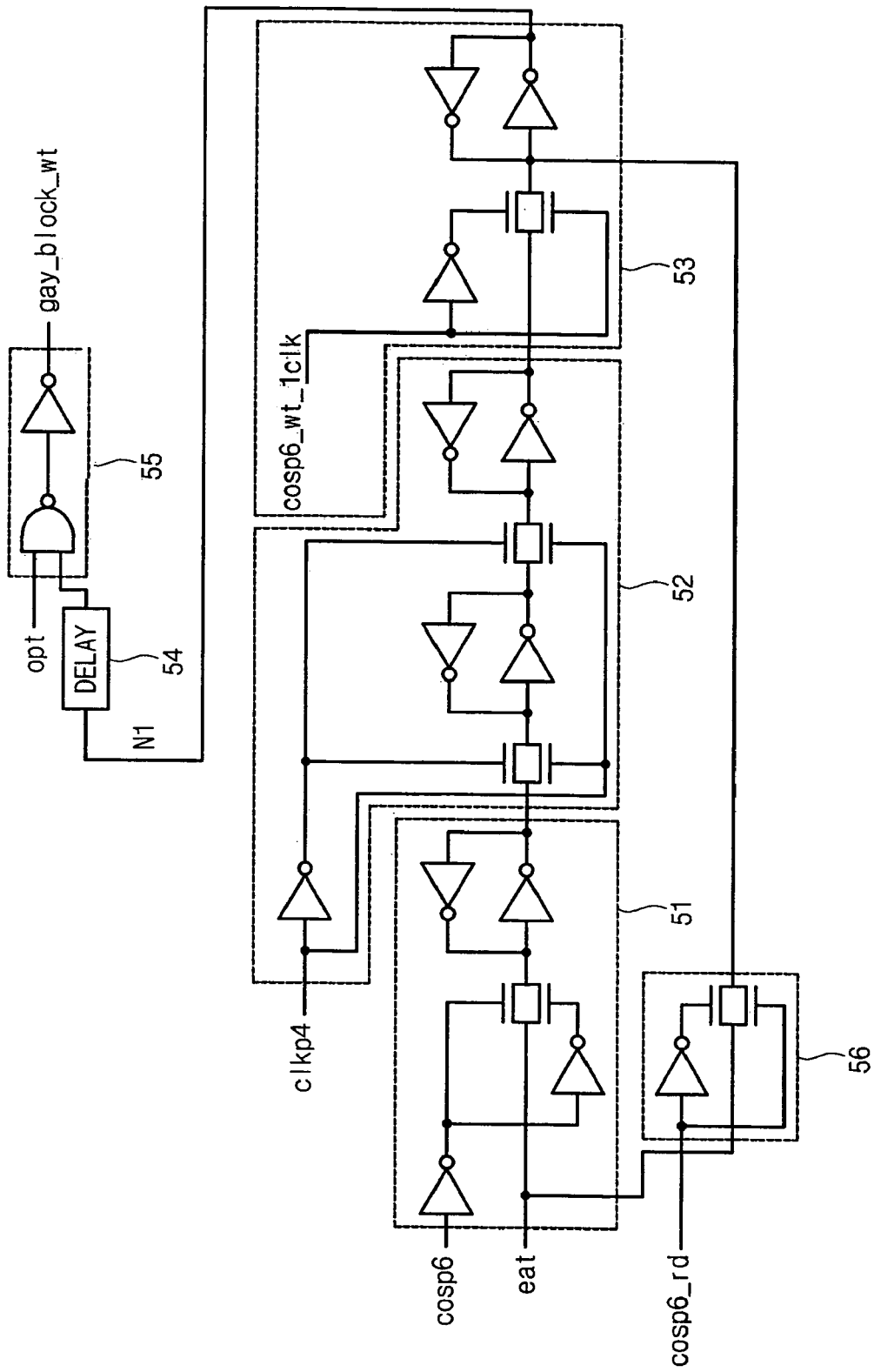
FIG. 5 is a circuit diagram showing the Yb shifter of FIG. 3 according to another embodiment of the present invention.

An embodiment for solving such a problem is shown in FIG. 5.

FIG. 5 is a circuit diagram showing an Yb shifter (block column address shifter) according to another embodiment of the present invention.

Referring to FIG. 5, the Yb shifter according to another embodiment of the present invention includes a first transmitter 51, a second transmitter 52, a third transmitter 53, a delay unit 54, an output unit 55 and a fourth transmitter 56. The first transmitter 51 synchronizes the input of an address 'eat' latched by a clock signal, which is applied from the external of the Yb shifter, with a pulse signal cas6 generated in a write command or a read command, and transmits the synchronized signal. The second transmitter 52 transmits the signal outputted from the first transmitter 51 in response to the input of an internal clock clkp4 synchronized with an external clock. The third transmitter 53 transmits the signal outputted from the second transmitter 52 in response to the input of a pulse signal cas6_wt_lclk generated after one clock after a write command. The delay unit 54 delays the signal outputted from the third transmitter 53. The output unit 55 inputs an optical signal (e.g., a ×16 relating signal in the ×16 type) opt and the output signal of the delay unit 54 and outputs a 1-clock shifted block column address gay_blcok_wt. The fourth transmitter 56 transmits the input of the address 'eat' to the third transmitter 53 in response to an input of a pulse signal cas6_rd generated in a read command.

In the above construction, each of the transmitters 51, 52, 53 and 56 is constructed by a transmission gate and a latch (but, the fourth transmitter 56 is constructed by only a transmission gate). Further, it is preferred that the delay unit 54 is constructed by a circuit (e.g., an inverter chain) capable of delaying the signal of a node N1. Furthermore, the output unit 55 is constructed by a NAND gate for inputting the optical signal opt and the output signal of the delay unit 44, and an inverter connected to the output terminal of the NAND gate.

The Yb shifter as shown in FIG. 5 is realized, thereby solving the problem in that the bus in the read operation must be additionally constructed.

Figure 6:
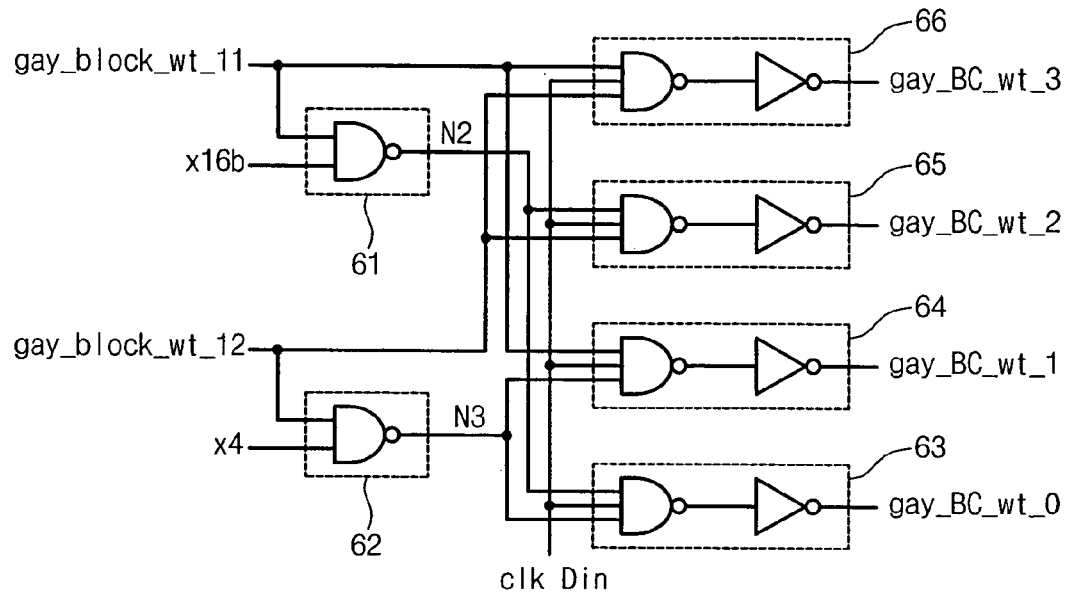
FIG. 6 is a circuit diagram showing the input selection signal generation circuit of FIG. 3 according to an embodiment of the present invention.

FIG. 6 is a circuit diagram showing the input selection signal generation circuit 304 according to an embodiment of the present invention. Specifically, FIG. 6 shows the input selection signal generation circuit 304 realized on an assumption that four driving signals are necessary for the two data bus writers 305 and 306 of FIG. 3.

Referring to FIG. 6, the input selection signal generation circuit 304 according to the present invention includes a first decoder 61, a second decoder 62, a first output unit 63, a second output unit 64, a third output unit 65 and a fourth output unit 66. The first decoder 61 inputs a 1-clock shifted block column address gay_blcok_wt_11 and an option signal x16b and the second decoder 62 inputs a 1-clock shifted block column address gay_blcok_wt_12 and an optio n signal x4. The first output unit 63 inputs the output signals of the first decoder 61 and the second decoder 62 and the control signal clk Din and outputs a first driving signal gay_BC_wt_0. The second output unit 64 inputs the 1-clock shifted block column address gay_blcok_wt_11, the output signal of the second decoder 62, and the control signal clk Din, and outputs a second driving signal gay_BC_wt_1. The third output unit 65 inputs the 1-clock shifted block column address gay_blcok_wt_12, the output signal of the first decoder 61, and the control signal clk Din, and outputs a third driving signal gay_BC_wt_2. The fourth output unit 66 inputs the 1-clock shifted block column address gay_blcok_wt_11, the 1-clock shifted block column address gay_blcok_wt_12, and the control signal clk Din, and outputs a fourth driving signal gay_BC_wt_3.

In the construction of FIG. 6, each of the first decoder 61 and the second decoder 62 is constructed by a NAND gate and each of the output units 63 to 66 is constructed by a NAND gate and an inverter.

Referring to the construction of FIG. 6, when the data input/output structure is the ×16 type, since the option signal x16b is logically in a low level and the option signal x4 also is logically in a low level, both the 1-clock shifted block column address gay_blcok_wt_11 and the 1-clock shifted block column address gay_blcok_wt_12 are logically in a high level. Further, the output signals of the first decoder 61 and the second decoder 62 also are logically in a high level. Accordingly, the driving signals gay_BC_wt_0 to gay BC_wt_3 operating the data bus writers 305 and 306 of FIG. 3 are logically in a high level, so that all data bus writers are enabled.

Meanwhile, when the data input/output structure is the ×8 type, since the option signal x16b is logically in a high level and the option signal x4 is logically in a low level, both the 1-clock shifted block column address gay_blcok_wt_12 and the output signal of the second decoder 62 are logically in a high level. Further, the 1-clock shifted block column address gay_blcok_wt_11 and the output signal of the first decoder 61 have values determined according to the input of the address 'eat' latched by the clock signal applied from the external of the Yb shifter 309. Accordingly, one of the second driving signal gay_BC_wt_1 and the fourth driving signal gay_BC_wt_3 is enabled, and one of the first driving signal gay_BC_wt_0 and the third driving signal gay_BC_wt_2 is enabled.

Further, when the data input/output structure is a ×4 type, since the option signal x16b is logically in a high level and the option signal x4 is logically in a high level, only one of the first to the fourth driving signal gay_BC_wt_0 to gay_BC_wt_3 is enabled.

Hereinafter, the operation of the data input circuit of FIG. 3 according to the present invention will be described in detail with reference to the embodiments shown in FIGS. 4 to 6.

First, in the operation of the ×16 type, data applied to each data buffer are applied to each data bus writer along the solid lines of the input multiplexer. Then, the data are applied to the block writer by the control signal clk Din. Accordingly, the basic data transmission path is identical to that of FIG. 1.

Next, in the operation of the ×8 type, it is assumed that data are applied to the data buffer 301 and data are not applied to the data buffer 302. Further, only the data buffer 301 is enabled by a control signal and the data buffer 302 is disabled.

A first case: the data D0_1 outputted from the data buffer 301 can be applied to the data bus writer 305 through a path 'a' by the input multiplexer 303. In such a case, the data D1_2 of an output terminal to which data are not sent maintain a previous state.

A second case: the data D0_1 outputted from the data buffer 301 can be applied to the data bus writer 306 through a path 'b' by the input multiplexer 303. In such a case, the data D0_2 of the output terminal to which the data are not sent maintain the previous state.

The data bus writers 305 and 306 receive the output signals D0_1 and D0_2 of the input multiplexer 303.

The Yb shifter 309 (block column address shifter) outputs a 1-clock shifted block column address Yb. Herein, the 1-clock shifted block column address Yb denotes a signal one-clock delayed after a block column address designating the specific block (i.e., memory block) of the memory bank by the write command has been applied.

The input selection signal generation circuit 304 receives the 1-clock shifted block column address Yb and the control signal clk Din and outputs the signal operating the operations of the data bus writers 305 and 306. Herein, the control signal clk Din denotes a signal generated in synchronization with a clock signal after two clocks after the write command.

In the operation of the ×16 type, the input selection signal generation circuit 304 allows the data bus writers 305 and 306 to be enabled.

In the operation of the ×8 type, the input selection signal generation circuit 304 selectively allows only one of the data bus writers 305 and 306 to be enabled. That is, the input selection signal generation circuit 304 allows only the data bus writer connected to the path (a or b) selected by the input multiplexer 303 to be enabled.

The operation after the data bus writer is identical to that of FIG. 1.

Figure 7:
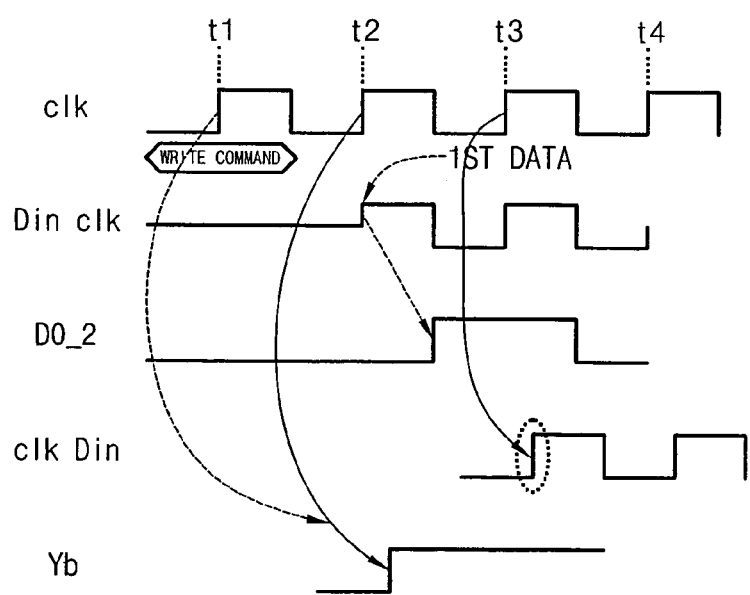
FIG. 7 is a waveform view illustrating the operation of the circuit of FIG. 3 according to the present invention.

FIG. 7 is a waveform view illustrating the operation of the circuit shown in FIG. 3 according to the present invention.

As shown in FIGS. 3 and 7, the input selection signal generation circuit 304 receives the 1-clock shifted block column address Yb and the control signal clk Din and controls the data bus writers.

Figure 2:
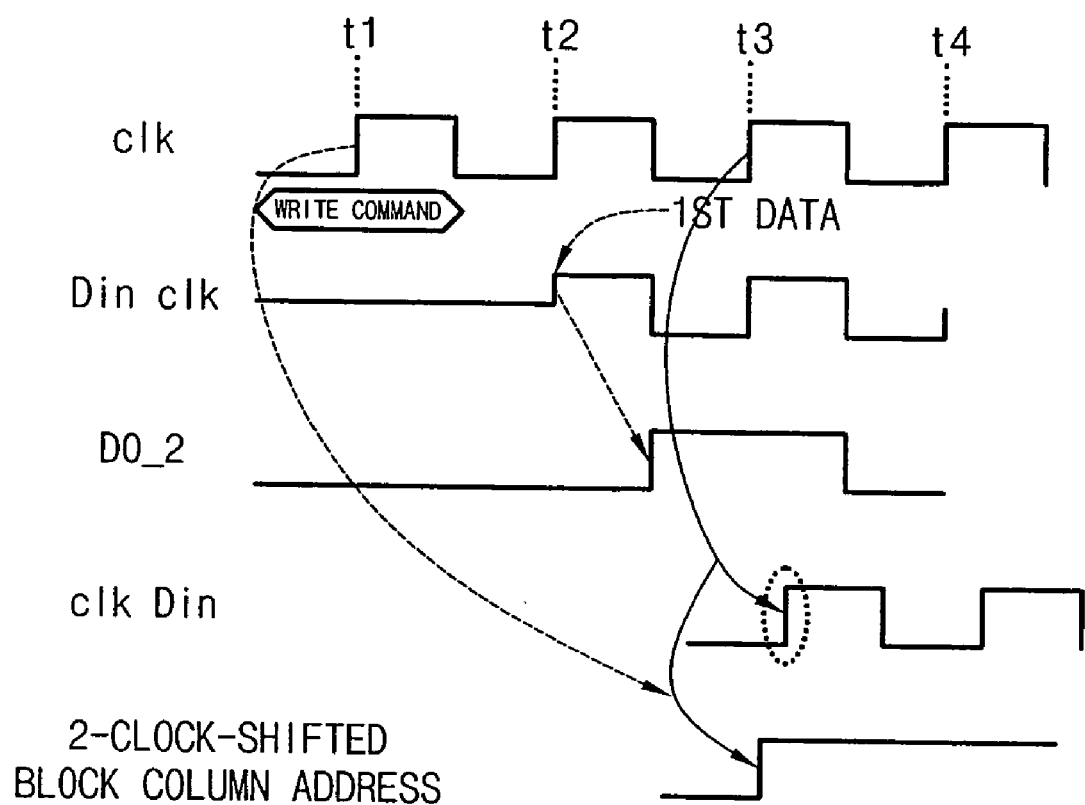
FIG. 2 is a waveform view illustrating the operation of the circuit of FIG. 1.

As compared to the conventional circuit described in FIGS. 1 and 2, in the prior art, a predetermined time margin is required until the control signal clk Din is generated after the 2-clock shifted block column address has been generated. Therefore, the data processing speed is delayed.

However, in the present invention, the 1-clock shifted block column address is used, so that the generation time point of generation of the control signal clk Din may be earlier than that of the prior art. That is, in the present invention, even though the control signal clk Din is immediately generated after a two-clock delay after the write command, there occurs no any problem. Therefore, the operation time point of the input selection signal generation circuit 304 can be earlier. In the present invention, the ×16 type, the ×8 type and the ×4 type are described. However, the technical scope of the present invention can be applied to various cases including a ×32 type, etc.

As described above, in the present invention, a 1-clock shifted block column address is used, so that the operation time point of a data bus writer can be advanced, thereby accelerating the data processing speed. Further, in the present invention, a design in which a control signal clk Din can pass a shortest path can be made.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. An input circuit for a memory device comprising:
a first data bus writer;
a second data bus writer;
a clock shifter configured to generate a 1 clock shifted block address; and
an input select signal generator configured to control the first and the second data bus writer with the 1 clock shifted block address;
wherein said clock shifter is comprised of a plurality of series-connected transmitters, each transmitter of the plurality of transmitters synchronously transmitting an input signal to a corresponding output by a clock signal input to each transmitter, the third transmitter output being coupled to a delay unit to provide said 1 clock shifted block address.

2. The input circuit of claim 1, wherein the plurality of transmitters is comprised of first, second and third, series-connected transmitters.

3. The input circuit of claim 1, wherein each transmitter is comprised of a transmission gate and a latch.

4. The input circuit of claim 2, wherein each of the first, second and third transmitters is comprised of a transmission gate and a latch.

* * * * *